(12) United States Patent
Check et al.

(10) Patent No.: US 7,739,545 B2
(45) Date of Patent: Jun. 15, 2010

(54) SYSTEM AND METHOD TO SUPPORT USE OF BUS SPARE WIRES IN CONNECTION MODULES

(75) Inventors: Mark A. Check, Hopewell Junction, NY (US); Jonathan Y. Chen, Marlboro, NY (US); Thomas G. Foote, Milan, NY (US); Timothy J. Slegel, Staatsburg, NY (US)

(73) Assignee: International Business Machines Corporation, Armonk, NY (US)

( * ) Notice: Subject to any disclaimer, the term of this patent is extended or adjusted under 35 U.S.C. 154(b) by 582 days.

(21) Appl. No.: 11/531,430

(22) Filed: Sep. 13, 2006

(65) Prior Publication Data

US 2008/0082878 A1    Apr. 3, 2008

(51) Int. Cl.
*G06F 11/00* (2006.01)
(52) U.S. Cl. .............................. 714/10; 714/43; 714/724
(58) Field of Classification Search ........................ None
See application file for complete search history.

(56) References Cited

U.S. PATENT DOCUMENTS

| | | | | |
|---|---|---|---|---|
| 3,755,791 | A * | 8/1973 | Arzubi | 365/200 |
| 5,592,632 | A * | 1/1997 | Leung et al. | 710/316 |
| 6,334,163 | B1 * | 12/2001 | Dreps et al. | 710/260 |
| 6,436,725 | B2 | 8/2002 | Sakata | 438/14 |
| 6,506,634 | B1 | 1/2003 | Kohyama | 438/132 |
| 6,526,461 | B1 * | 2/2003 | Cliff | 710/100 |
| 6,982,954 | B2 * | 1/2006 | Dhong et al. | 370/225 |
| 7,073,088 | B2 * | 7/2006 | Jo | 714/5 |
| 7,219,314 | B1 * | 5/2007 | Trimberger et al. | 716/4 |
| 2001/0021129 | A1 | 9/2001 | Ishikawa | 365/189.12 |
| 2002/0048182 | A1 | 4/2002 | Ooishi | 365/63 |
| 2002/0147561 | A1 | 10/2002 | Baracat et al. | 702/119 |
| 2003/0097645 | A1 | 5/2003 | Wong | 716/4 |
| 2004/0022110 | A1 | 2/2004 | Haraguchi et al. | 365/222 |
| 2004/0136319 | A1 * | 7/2004 | Becker et al. | 370/225 |
| 2005/0081125 | A1 * | 4/2005 | Cochran et al. | 714/56 |
| 2005/0171756 | A1 * | 8/2005 | Gooding et al. | 703/23 |

FOREIGN PATENT DOCUMENTS

JP        403269899 A  * 12/1991  .................. 714/718

OTHER PUBLICATIONS

PCT/us181/001725, Aug. 5, 1982, Energy Conversion Devices Inc. (assignee).*
PCT/US1981/001725, Aug. 5, 1982, Energy Conversion Devices Inc. (assignee).

* cited by examiner

*Primary Examiner*—Gabriel L Chu
(74) *Attorney, Agent, or Firm*—Lynn L. Augspurger; John E. Campbell

(57) ABSTRACT

In a computer system with multiple chips connected via a connection module with high speed elastic interface buses that support bus repair is enhanced by use of a spare net. Support is provided to ensure that the spare net can be tested in the same way that every normal bus net can be tested at all supported environments. It ensure that the system controller can find out what connections are bad and how to apply the controls to repair them for all tests and in the field for the customer.

17 Claims, 4 Drawing Sheets

An Elastic Interface Bus Topology with the Spare Net

FIGURE 1 Chips on the Connection Module
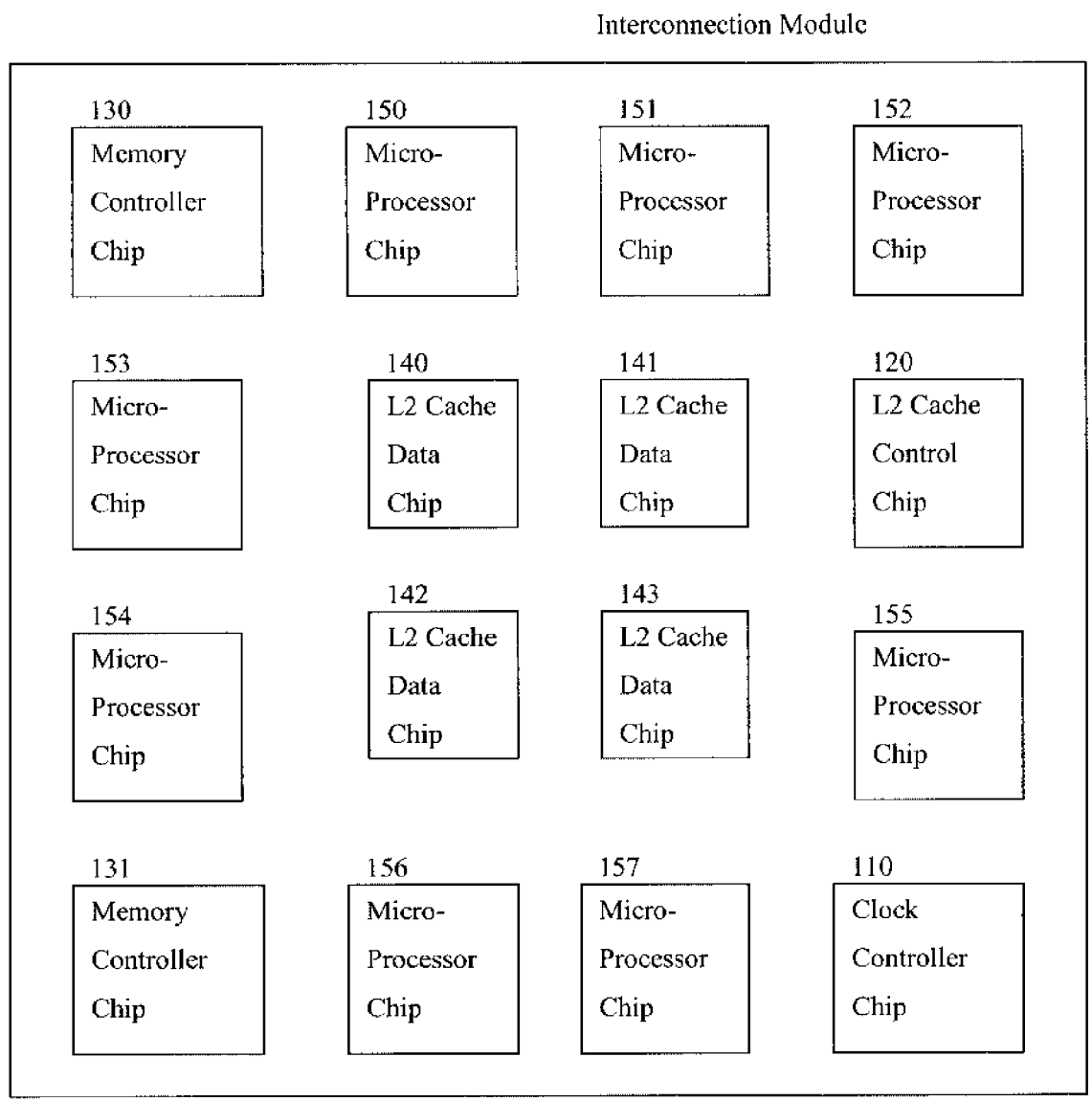

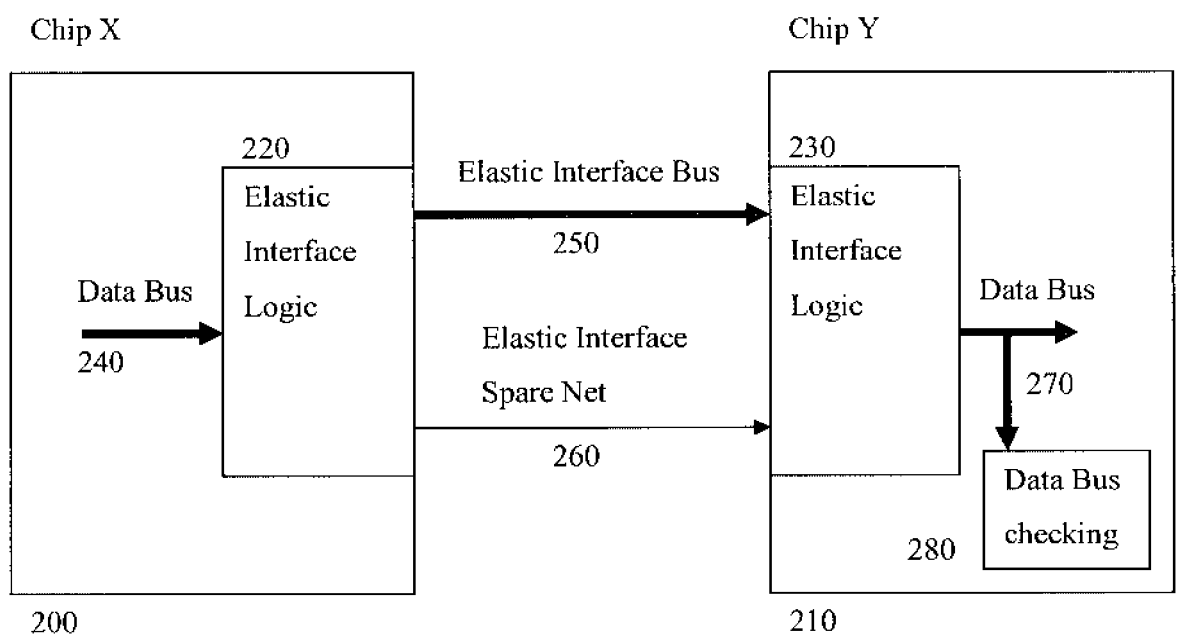
FIGURE 2 An Elastic Interface Bus Topology with the Spare Net

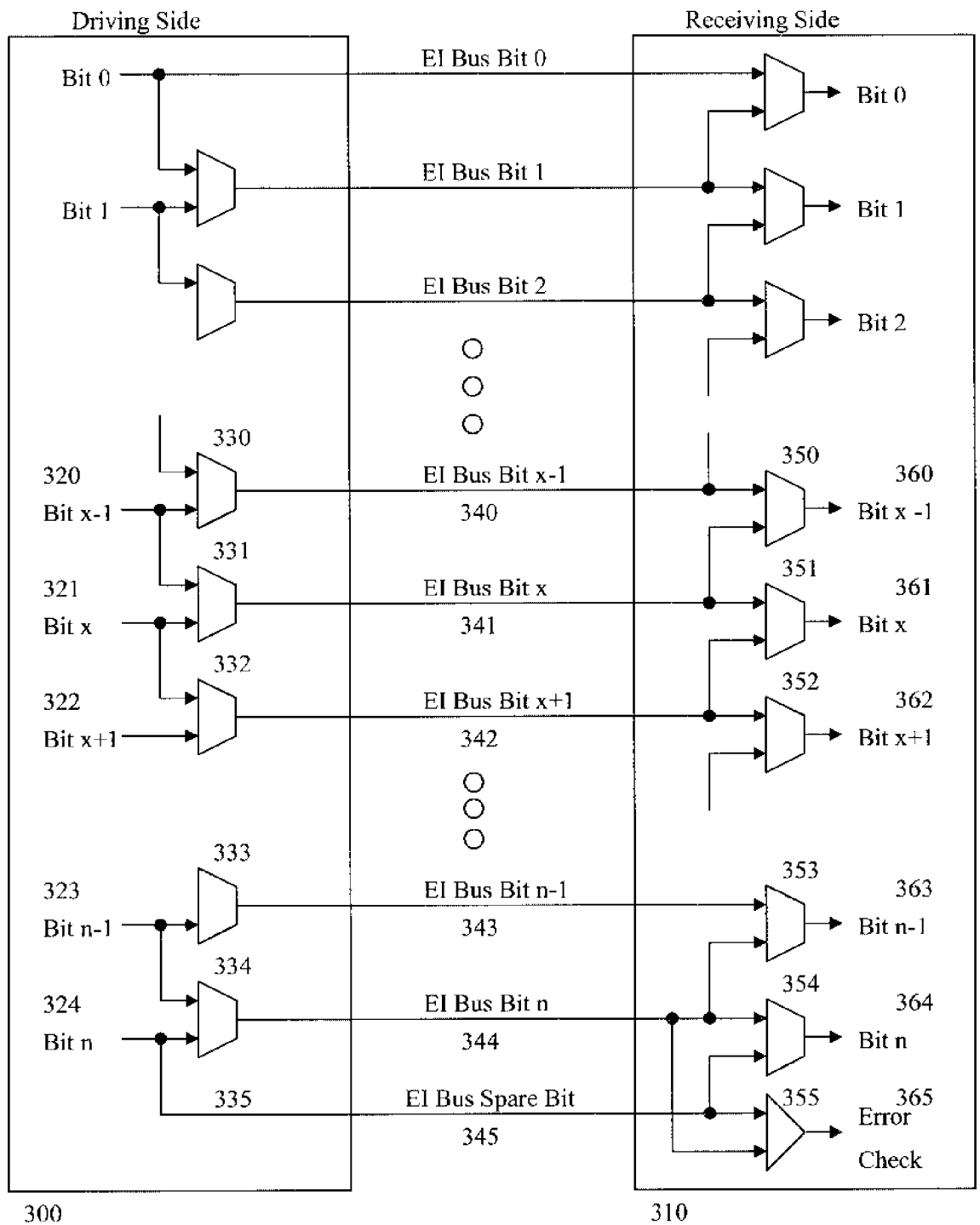
FIGURE 3 The Elastic Interface Bus Repair Structure with Testability structures FIGURE 4 The recording of the Elastic Interface Repair Information in E-Fuses
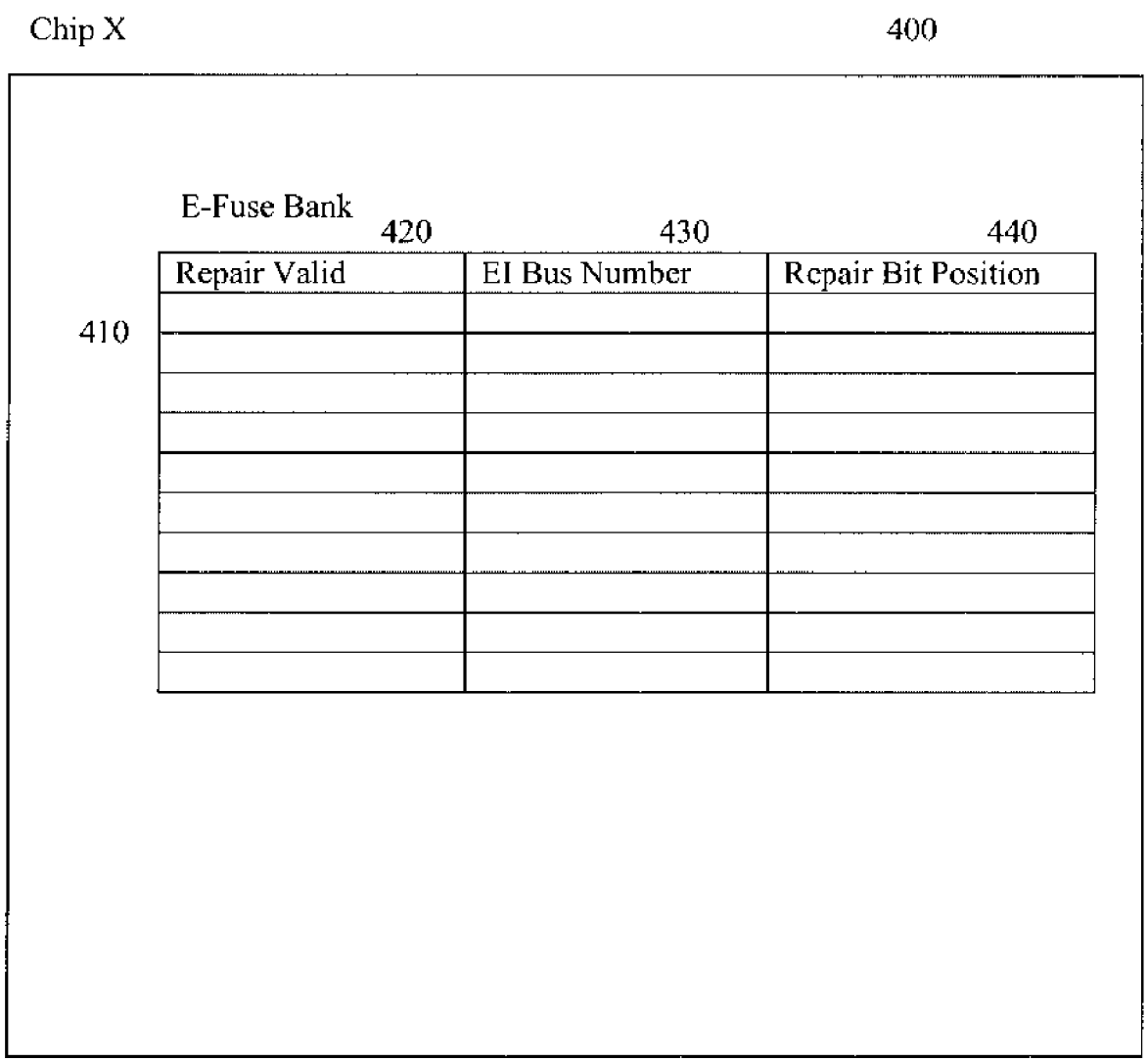

SYSTEM AND METHOD TO SUPPORT USE OF BUS SPARE WIRES IN CONNECTION MODULES

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to using elastic interface spare bus wires and particularly to support them for manufacture and support in the field by ensuring proper testing of the spare nets and a means to record the nets to repair on the module that are accessible by the service structure for the system.

2. Description of Background

The IBM Corporation for many generations has used glass ceramic interconnection modules in its manufacture and design of large computer systems. These modules have many layers of connections in them and are used to provide bus connections from chip to chip and from the chips to the hoards and cards they are connected to. These modules contain many multi-bit wide buses between the various chips mounted on them. In the past when there was a manufacturing defect in the connections in the module there were two choices. It could be re-worked and the defect wire could be re-routed near the surface of the module. This requires a unique fix for every module wire failure. There are limits to how many and which net connections could be fixed in this way. The other choice was to scrap the module as unfixable. In recent generations IBM has been using the Elastic Interface first patented as U.S. Pat. No. 6,334,163 published Dec. 25, 2001 wherein an elastic interface apparatus and method is implemented.

An Elastic Interface (EI bus connections) can be generalized in that these are bus connections which are high speed interfaces that have clock sent with data. All of the data bits are aligned to the clock to be able to latch the data at these high speeds. It requires that the net topology and timing characteristics for each net on the bus are at least similar to each other in order to make it possible to line up the edges of the data to the clock. In this environment re-working connections in the connection module were not easily possible due to the fact that all the nets had to have similar topology and timing characteristics. This increased the difficulty of a re-work solution or made it impossible. This increased the modules that needed to be scrapped as not usable.

The advent of Elastic Interface repair (such as shown in IBM assigned US Patent application number US 2004/0136319 A1, filed Jan. 9, 2003 incorporated herein by reference) introduced the concept of a spare wire built in the bus interface in the connection module that had the same topology and characteristics of the rest of the nets in the bus. It includes the hardware to be able to switch from the bad net in the interface to the spare net. However this operation must now be supported from original manufacture and through out to the customer use in the field. The connection module is tested at several different process corners such as low and high temperature, low and high voltages are good examples of some of these process corners. When a net on the interface is known to be bad the spare net should be used on the bus for testing and the known bad net should not be tested. When the bus does not have a defect the spare net needs to be tested in addition to all the functional nets. In the original design specification for the EI spare not it was driven with a constant zero when not used.

The machine service structure must be able to obtain the information about what nets to repair and be able to apply that repair each time the machine is powered on. It also must be easy to apply as it must be done to both sides of the repaired bus. This recording of which nets are bad and require spare net repair actions must be done after the chips have been mounted on the module.

SUMMARY OF THE INVENTION

The shortcomings of the prior art are overcome and additional advantages are provided through the provision of means to ensure proper testability of the product in manufacture and field support for the customer. For instance the recording of which nets are bad and require spare net repair actions must be done after the chips have been mounted on the module. This is done via the use of an E-Fuse (such as that described first in IBM U.S. Pat. No. 6,624,499 issued Sep. 23, 2003 and enhanced in IBM assigned US Patent application number 2006/0087001 A1, filed Oct. 21, 2004 incorporated herein by reference) recording on one of the chips on the connection module. A more detailed view of the invention may be had by reviewing the claims made herein in light of the technical effects and detailed description described below.

TECHNICAL EFFECTS

Our invention has several aspects in order to support the use of the elastic interface spare bus nets to repair faults in the connection module. There are several related aspects. They are all related to support of the elastic interface spare net repair in manufacturing and support in the field to be able to use them. When the connection modules are manufactured and before chips are mounted on them they are nothing more than wiring layers with no active components on them. It is easy to test each net connection to ensure there are no open or shorted nets. It is not as clear if there are nets that will fail when run at targeted switching speeds. The results of these tests are known on a module by module basis. Our chosen implementation of elastic interface repair by spare net can repair one net per bus interface. This was done to balance the how many spare nets must be wired against the probability of failures. It would be possible to build more than one spare net into each bus. We also looked at the characteristics of failure. With many thousands of connections made in the connection module it is somewhat common to have at least one such net failure. However the total net failures in a given connection module are either none, just a few, or catastrophic net failure. Thus the solution is tailored to support that case of just a few net failures. We have chosen to support up to 10 such failures on any given module. It would be possible to support fewer or a larger number. It is also important to be able to tell the difference between known failures due to original manufacture of the connection module versus a problem created due to improper mounting of the chips onto the connection module.

The module prior to the mounting of the chips on it undergoes a certain set of tests. Then once the chips are mounted it is tested by both testers and in real systems. These tests are often run at many different design corners to ensure that it will operate for the customer in the entire range that we as a company specify its operation. This may include low temperature, high temperature, low power supply voltage, high power supply voltage, different frequency ranges, or other tests designed to ensure the product will operate correctly in the customer's office environment. All nets that will be used must be tested at these different test points. In order to run these tests all known failures based on static tests of the nets in the connection module must first be solved by use of the spare net on the elastic interface. Some of the tests that will be run will be at system frequencies. It is possible that other failure nets may be found at some point during these tests. It is possible to then again repair the failing net by use of the spare net on that bus interface. However it is not desirable after needing to spare a net to have to repeat any of the corner design tests. In addition in order to be able to detect and repair a net connection in the connection module that fails while in the customer environment all possible spare nets that might need to get used must be tested to the same level as any net tested in prior to shipment to the customer.

In the elastic interface bus the bits are carefully controlled and adjusted by the elastic interface circuitry to make all the bits appear that they arrived at the same time. The spare net that is included in a given bus is included in this careful construction of the net topology and net timing as all the other bits in the bus. This is what allows it to be used as the spare net without being of concern that it will behave just like all the other nets on the bus interface. When calibration of the bus interface is run the spare net is included in the calibration and adjustment phase to ensure the bus operates. However once done the spare bit serves no purpose until or unless it is used in a bus repair action. The application bus that transmitted into the EI logic and out of the EI logic will be exactly the size of the bus to be transferred. However since the actual EI bus with its spare net is one larger in size there is nothing to drive that spare bit. In order to ensure that the spare bit operates just as any other bit on the bus we have chosen to (on the driving side) drive what ever the last bit on the application bus is all the time and not just when the repair action requires it. Then on the receive side of the EI bus when there has been no bus repair action the last expected bus bit and the spare bit are compared to see if they are the same. In this way every cycle that a value is put on the real bus bit the spare bus bit has the same value and can be checked for operation. When the bus has taken a repair action to use the spare bit it is no longer known that the last logical bit is on the last expected bus bit. Thus the checking is disabled because the spare is now used as an active bus bit.

Now that the chips are mounted on the module and any known failures prior to mounting are known we must somehow record the information about what bits are bad and must be repaired by the spare bus bit. It must be done in such a way that no matter what system it resides it is possible to take the bus bit sparing actions. It must also be done if a way that is not prone to errors. The solution used was to use an electronic fuses, called E-Fuse, (referenced above and incorporated herein by reference). These fuses can be programmed in the chip where they reside after the chip has been mounted on the module. In this way the information can be programmed after they have been mounted to any given connection module with the known manufacture faults and later during the test process but before they are shipped to customers they may be updated. Further since they are part of that module and can be read by the service element on the machine there is no opportunity to lose or get the wrong list. It can be read an applied as many times as is needed including every time the machine gets powered on. We have chosen to place these e-fuses on the cache controller chip. The chip has a single copy per module and thus there is one and only one source to look for the data by the service element. Second the e-fuses re record the result of 10 repairs do take some space and this chip as ample space as its size is dictated by the I/O count not the cell count.

The cache controller chip stores the information about what EI buses need spare repair for each module. Each bus on the chip is given a unique bus number identifier. Since only one spare is allowed per bus, each bus will only occupy on entry in the table. The information on the sparing action also includes a bit position that is bad. It is encoded in such a way that it is in fact the value that is loaded into the EI bus controls that are used to control the muxes on both the driving and receiving side of the bus. In that way the service element only has to use the bus number to know to which pair of elastic interfaces to apply the value provided in the e-fuse structure. Each entry has a valid bit. The service element can read these e-fuse values from the cache controller chip and apply the updates after all the chips have been powered up and before any calibration of the elastic interfaces take place. Thus when they are calibrated the spare nets are already in use and any bad nets are no longer used as they have been skipped on the bus interface.

As a result of our invention a computer system with multiple chips connected via a connection module with high speed elastic interface buses that support bus repair is enhanced by use of a spare net. Support is provided to ensure that the spare net can be tested in the same way that every normal bus net can be tested at all supported environments. It ensures that the system controller can find out what connections are bad and how to apply the controls to repair them for all tests and in the field for the customer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 illustrates an example of the chips that may be mounted on the connection module.

FIG. 2 illustrates an example of Elastic Interface between two chips with the inclusion of a spare net for bus repair FIG. 3 illustrates the design for Elastic Interface Repair and structures required to test the spare net.

FIG. 4 illustrates an example of use of the Electronic Fuse technology to support Elastic Interface Repair.

The detailed description explains the preferred embodiments of the invention, together with advantages and features, by way of example with reference to the drawings.

DETAILED DESCRIPTION OF THE INVENTION

In some of the current IBM servers the chips that make up the central electronics complex that may include the system controller or L2 cache memory, microprocessors, and memory interface controllers are mounted on a connection module. There are numerous high frequency high bandwidth buses that communicate via IBM elastic interface buses. These buses may include spare bus bits to allow a given elastic interface to operate even when there is a fault in the connection module. In FIG. 1 see just such an example of the connection model used in the IBM system z9. The module, 100, contains 1 single clock controller chip, 110, a single L2 cache controller chip, 120, two memory controller chips, 130 and 131, four L2 cache data chips, 140-143, and eight microprocessor chips, 150-157, each of which contain 2 microprocessor cores. This module is referred to as the central electronics complex or CEC.

In FIG. 2 we see a single such elastic interface (EI) bus from the driving chip X, 200, to the receiving chip Y, 210. The EI logic on the driving chip, 220, drives the elastic interface bus, 250, and the EI spare net, 260, to the receiving EI logic on the receiving chip, 230. The data bus may include checking that is used to detect which bit on an interface bus is bad. This may include such checking as ECC codes that are able to detect exactly which data bit is incorrect.

In FIG. 3 the details of how the EI spare net operation is used. For a given EI bus that is n+1 bits in length, bit 0 to bit n there will be an EI bus of size n+2 including the spare bit. By example for a given set of three bits of the bus sourced in the driving side, 300, bus bits x−1, x, and x+1 labeled 320, 330, and 340. Any two adjacent bits of the bus can be muxed by the 2:1 muxes, 330, 331, or 332, into one of two possible bit positions on the EI bus bits, 340, 341, or 342. On the receiving side, 310, these EI bus bits, 340, 341, or 342 are each sinked into two receive side muxes 350, 351, or 352. This in turn will produce the bits in the receive side bus bits x−1, x, x+1, 360, 361, or 362. Let's look at just bit x of the bus in the two cases of a non-spared bus and a spared bus. When the bus has not been spared bit x will feed two different muxes, 331 and 332. The controls on these muxes will set such that drive side bit x, 321, will propagate out of mux, 331, to the EI bus bit x, 341. In the receive side this EI bus bit x, 341 will be connected to two different muxes, 350 and 351. Again the mux controls will be set to that bit x will propagate out of mux 351 to become receive side bus bit x, 361. In the case of a bad net on the EI bus prior to bit x of the EI bus, 341, a sparing action will take place. The controls for the EI muxes will be altered. In this case drive side bit x will be muxed by mux 332 onto EI bus bit x+1, 342. In the receive side EI bus bit x+1, 342, enters the receive mux 351. In this case the controls are set to propagate the EI bus bit x+1, 342 out mux 351 to again become receive side bus bit x, 361.

Now that we have seen how any generic bit x behaves with and without the spare action. Let us again look at FIG. 3 to see what occurs with the last two bits of the EI bus. For driver side bus bits n−1 and n, 323 and 324, feed to muxes 333 and 334. These bits then normally propagate out to EI bus bits n−1 and n, 343 and 344. These EI bus bits then feed muxes on the receive side, 353 and 354. These then propagate to the receive side bus bits n−1 and n, 363 and 364. When the bus is not being spared the EI bus spare net has no functional role. In order to test it always we chose to eliminate the mux between driver side bus bit n, 324, and a fixed value of ground that would have been 335. Rather we chose to when the EI spare bit, 345, is used or not to drive it with driver bus bit n, 324. Then on the receive side we build a checking circuit to verify that when the spare bus bit, 345, is not used functionally that its value matches that EI bus bit n, 344. This is done by the checking circuit 355. The checking logic gets disabled when the sparing action occurs on the EI bus and the EI spare bit, 345, is used functionally. This is reported as an error checker signal, 365. So in the case where the spare bit is not used driving side bus bits n−1 and n, 323 and 324, propagate through muxes 333 and 334 to EI bus bits n−1 and n, 343 and 344. These bits in turn feed the muxes 353 and 354 on the receive side to generate receive bus bits n−1 and n, 363 and 364. Driver side bit n, 324, is also driven on EI spare bit, 345. On the receive side EI bus bit n, 344, and EI spare bit, 345, are checked in compare logic, 355, to generate a error signal, 365. When the bus has been spared driver side bus bit n−1, 323, propagates through mux 334 to EI bus bit n, 344, to mux 353, to generate receive side bit n−1, 363. Driver side bit n, 324, is drive on the EI spare net, 345, to receive side mux 354, to provide receive side bus bit n. The checking logic in 355 is disabled as the EI spare bit, 345 and EI bus bit n, 344 are no longer the same.

It is doing this checking when the bus is not spared that allows the spare net to be tested at all functional and environmental tests that all normal bus nets are tested at. This allows the spare net to be used at any step in the manufacture testing or in the customer's office as a spare net and know it has met all of the required testing like all other functional bus bits.

In FIG. 4 we have an example of the chip on the connection module that will hold the information on which nets should be spared for this module. In chip X, 400 which we have chosen as one of the chips that has a single instance on the connection module are the e-fuse array, 410. This bank of e-fuses will consume a non-trivial amount of area but not lead to any significant number of chip I/O. The values will be read via a scan method by the service element in the system at system power-on from the internal values the e-fuses provide. For each desired EI sparing action the valid bit, 420, will be set. In addition an EI bus number will be specified, 430. This will be used by the service element to know which pair of EI logic driver and receiver logic, 220 and 230, need to have the sparing controls set. The repair bit position, 440, indicates which bit needed to be spared and is encoded in such a way as to match how the mux controls for all the muxes on the driver and receiver side must be set to get the correct sparing action. This makes it easy for the service element to apply to both sides of the interface. These e-fuses, 410, are programmed on the module after the chips have been mounted to it based on the original manufacturing data about which nets were bad in the connection module.

The capabilities of the present invention can be implemented in software, firmware, hardware or some combination thereof.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations within the scope of the claims are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A computer system, comprising
a computer system having a connection module having a plurality of chips mounted thereon, said chips of said connection module including a clock controller, a cache controller chip, a memory interface with memory controller and cache data chips, and a plurality of microprocessor chips, and wherein said processing chips are coupled for communication among said chips on said connection module with elastic interface multi-bit buses between the processing chips also having connection module spare nets for spare bits forming a spare network of a plurality of spare nets able to repair one or more of said elastic interface multi-bit buses such that upon repair it operates even when there is a fault in the connection module, and wherein programmable electronic fuses in said module record information about chips in said module as recorded information as to known manufacturing faults of said chips of said module, said fuses' recorded information being updatable after testing of the module to record information about any known repair by a spare bit on a spare net of said spare network, said spare nets being fully testable by checking logic for testing said spare nets on the connection module when the multi-bit buses' nets are not spared just as all normal elastic interface multi-bit buses' nets' functional bus bits are tested for function and environmental tests allowing a spare net to be used at any step in the manufacture testing or at a customer's office as a spare net to know it has met all required testing like all other functional bus bits, and wherein said checking logic is configured such that for every cycle that a value is put on one of the multi-bit buses, during testing, that said value put on the one multi-bit bus matches another value of a spare net which can be checked for operation.

2. The computer system according to claim 1 wherein said connection module has a plurality of the chips of the system mounted on it and said multi-bit buses communicate between the chips from a driving side of a multi-bit bus to a receiving side of said multi-bit bus on the connection module and said spare nets use spare bits which operate just as any other bit on the multi-bit bus by driving what ever is the last bit on the driving side of a multi-bit bus all the time, and wherein on the receiving side of the multi-bit bus a comparison is made of the last expected multi-bit bus bit and a spare bit to determine that they are the same.

3. The computer system according to claim 2 wherein said spare network provides a spare bus network of circuit nets built into the connection module that are coupled for use to repair a net in the bus that was bad due to a manufacturing defect and when a repair action has been taken to use a spare bit and as a consequence the last logical bit may not be said last expected multi-bit bus bit and checking by said checking logic is disabled because the spare bit is now used as an active bus bit.

4. The computer system according to claim 3 wherein said spare nets are fully testable, and when a known connection made to the spare network is made, said checking logic reads said recorded information to ensure a predictable value is driven on the spare network even when not used.

5. The computer system according to claim 4 wherein checking logic ensures that the spare network is operating as desired through all test parameters that the module is tested at during a manufacture test.

6. The computer system according to claim 5 wherein more than one chip is coupled to use said connection module with multi-bit buses between the chips to be able to test and repair the bus, and all of said chips have fully testable spare networks.

7. The computer system according to claim 2 including error detection hardware logic for the multi-bit bus that can detect a bad bit on a chip's multi-bit bus interface, detect which specific bit said bad bit was, and report said bad bit to a service module for the computing system which can then repair the multi-bit bus to correct the defect by setting correct control values in elastic interface repair logic.

8. The computer system according to claim 7 wherein a correction of a defect by setting correct control values in elastic interface checking logic occurs after the final manufacture repair settings have been made.

9. The computer system according to claim 8 wherein said computer system is comprised of more than a single connection module; and wherein
a connection module has chips of the system mounted on it with multi-bit buses that communicate between the cache controller chip on each connection module; and
wherein the spare network built into each connection module is used to repair a net in a multi-bit bus that was bad due a manufacturing defect.

10. The computer system according to claim 1 wherein said computer system has a plurality of connection modules, each with its own cache controller chip and where the buses between the chips of said connection modules are high speed elastic interfaces with recorded information about repair for each connection module.

11. The computer system according to claim 9 wherein the cache controller chip on each connection module has electronic fuses that can be programmed after the chip has been mounted on the connection module to store the information for one more known manufacture connection faults.

12. A computer system according to claim 1 wherein said checking logic for said plurality of chips connected via a connection module with high speed elastic interface multi-bit buses supporting bus repair is enhanced by use of a spare network formed on said chips enabling testing of said multi-bit buses.

13. The computer system according to claim 12 wherein the spare network can be tested in the same way that every normal bus net can be tested at all supported environments and the programmable fuses can be programmed to record information in the cache controller chip where they are programmed after the cache controller chip has been mounted on the connection module with the known manufacture faults and later, during the test process but before they are shipped to customers, the fuses are updated with recorded repair information a service element of the computing system such that the fuses can be read and applied as many times as is needed including every time the machine gets powered on.

14. The computer system according to claim 13 wherein the chips of a connection module are coupled to a system controller to ensure said system controller can find out what if any connections in the chips coupled to the system controller are bad and how to apply controls to repair them for all tests and in the field for a customer.

15. The computer system according to claim 11 wherein information stored in said electronic fuses of a cache controller chip contain a designated bus number used to locate elastic interface controls for both a driving and a receiving side and repair bit position and which are encoded the same way as elastic interface repair logic controls are defined.

16. A method of testing a computer system having a connection module, comprising the steps of:
mounting on said connection module a plurality of chips, said chips of said connection module including a clock controller, a cache controller chip, a memory interface with memory controller and cache data chips, and a plurality of microprocessor chips; and
coupling said chips for communication among said chips on said connection module with an elastic interface providing multi-bit buses between the chips and with connection module spare nets for spare bits forming a spare network of a plurality of spare nets able to repair one or more of said elastic interface multi-bit buses such that upon repair it operates even when there is a fault in the connection module; and
after mounting said chips on said connection module, recording information about any known test failure of a chip on programmable electronic fuses in said cache controller chip as to what bits are known to be bad and must be repaired, after mounting on said connection module, by a spare bit on a spare net of said spare network; said recorded information including for a desired sparing action a setting for a valid bit, a bus number, and a repair bit position which indicates which bit needs to be spared in a repair encoded to control the checking logic such that controllers on the driver and receiver side of a bus must be set to get a correct sparing repair action, and testing for manufacture testing, via said spare network provided on chips of a connection module for said multi-bit bus chips, with checking logic for when the multi-bit buses' nets are not spared just as all normal elastic interface multi-bit buses' nets' functional bus bits are tested for function and environmental tests, wherein said checking logic is configured such that for every cycle that a value is put on one of the multi-bit buses, during testing, that said value put on the one multi-bit bus matches another value of a spare net which can be checked for operation, and upon detection of circuit nets built into the connection module that are bad but coupled for use, repairing, with said correct sparing repair action, a net in a multi-bit bus that was bad due to a manufacturing defect.

17. The method according to claim 16 wherein said method is performed as a service of said computer system after repair of a manufacturing defect, further comprising:

upon power-up of said computer system a service element of the computer system reads the e-fuse values from the cache controller chip to apply the updates after all the processing chips have been powered up and before any calibration of the elastic interface takes place such that the spare nets already in use are calibrated as any bad nets no longer in use have been skipped, and the elastic interface is calibrated with the spare nets in use to determine that the net topology and timing characteristics for each net on the bus are at least similar to each other in order to make it possible to line up the edges of the data to the clock for proper functioning of the elastic interface each time the computer system is powered up.

* * * * *